United States Patent
Ohtsuki et al.

(10) Patent No.: US 7,248,523 B2
(45) Date of Patent: Jul. 24, 2007

(54) STATIC RANDOM ACCESS MEMORY (SRAM) WITH REPLICA CELLS AND A DUMMY CELL

(75) Inventors: Hirohisa Ohtsuki, Ashiya (JP); Kazuo Itoh, Takatsuki (JP); Katsuji Satomi, Osaka (JP); Hironori Akamatsu, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 113 days.

(21) Appl. No.: 11/218,601

(22) Filed: Sep. 6, 2005

(65) Prior Publication Data

US 2006/0050586 A1   Mar. 9, 2006

(30) Foreign Application Priority Data

Sep. 8, 2004  (JP)  .............................. 2004-260760

(51) Int. Cl.
G11C 7/14 (2006.01)
G11C 11/41 (2006.01)
G11C 11/413 (2006.01)
G11C 29/24 (2006.01)
G11C 7/08 (2006.01)

(52) U.S. Cl. ...................... 365/210; 365/154; 365/202; 365/189.07

(58) Field of Classification Search ................ 365/210, 365/205, 202, 196, 195, 194, 156, 154, 189.07
See application file for complete search history.

(56) References Cited

U.S. PATENT DOCUMENTS

| | | | | |
|---|---|---|---|---|
| 5,689,471 A | * | 11/1997 | Voss et al. | 365/210 |
| 6,556,472 B2 | | 4/2003 | Yokozeki | |
| 6,646,938 B2 | | 11/2003 | Kodama | |
| 6,717,842 B2 | * | 4/2004 | Watanabe et al. | 365/154 |
| 6,831,853 B2 | | 12/2004 | Lin et al. | |
| 6,950,354 B1 | * | 9/2005 | Akiyoshi | 365/200 |
| 6,982,914 B2 | * | 1/2006 | Ohtsuki et al. | 365/210 |
| 7,136,318 B2 | * | 11/2006 | Ohtsuki et al. | 365/210 |
| 2001/0040817 A1 | * | 11/2001 | Azuma | 365/154 |

FOREIGN PATENT DOCUMENTS

| | | |
|---|---|---|
| JP | 9259589 | 10/1997 |
| JP | 2003036678 | 2/2003 |

* cited by examiner

*Primary Examiner*—J. H. Hur
(74) *Attorney, Agent, or Firm*—Stevens, Davis, Miller & Mosher, LLP (57) ABSTRACT

A static random access memory (SRAM) includes a memory array, a sense amplifier circuit, a replica circuit and a dummy cell. The replica circuit has the same elements as memory cells, and includes plural replica cells which output a signal whose level corresponds to the number of stages provided to a common replica bit line. The dummy cell is connected as a load with the common replica bit line. The source of a drive transistor of the dummy cell is connected with a power source which is at the High level. This suppresses a leak current flowing from a replica bit line to the dummy cell.

6 Claims, 11 Drawing Sheets

RELATED ART

Fig. 9

RELATED ART

STATIC RANDOM ACCESS MEMORY (SRAM) WITH REPLICA CELLS AND A DUMMY CELL

BACKGROUND OF THE INVENTION

1. Field of the Invention

The present invention relates to a semiconductor memory device which generates, by means of a replica circuit comprising a replica cell whose structure is identical to that of a memory cell which is contained in a memory array, a start-up timing signal for a sense amplifier circuit.

2. Background Art

There are a number of methods for a conventional semiconductor memory device to generate a timing signal for a sense amplifier which amplifies data read from a memory cell and ensures that the timing of reading from a memory cell follows changes attributable to a process, a voltage, etc. Among these is a method of generating a timing signal using a replica circuit (See Patent Literature 1 and Patent Literature 2 for instance). This method will now be described.

Figure 8:
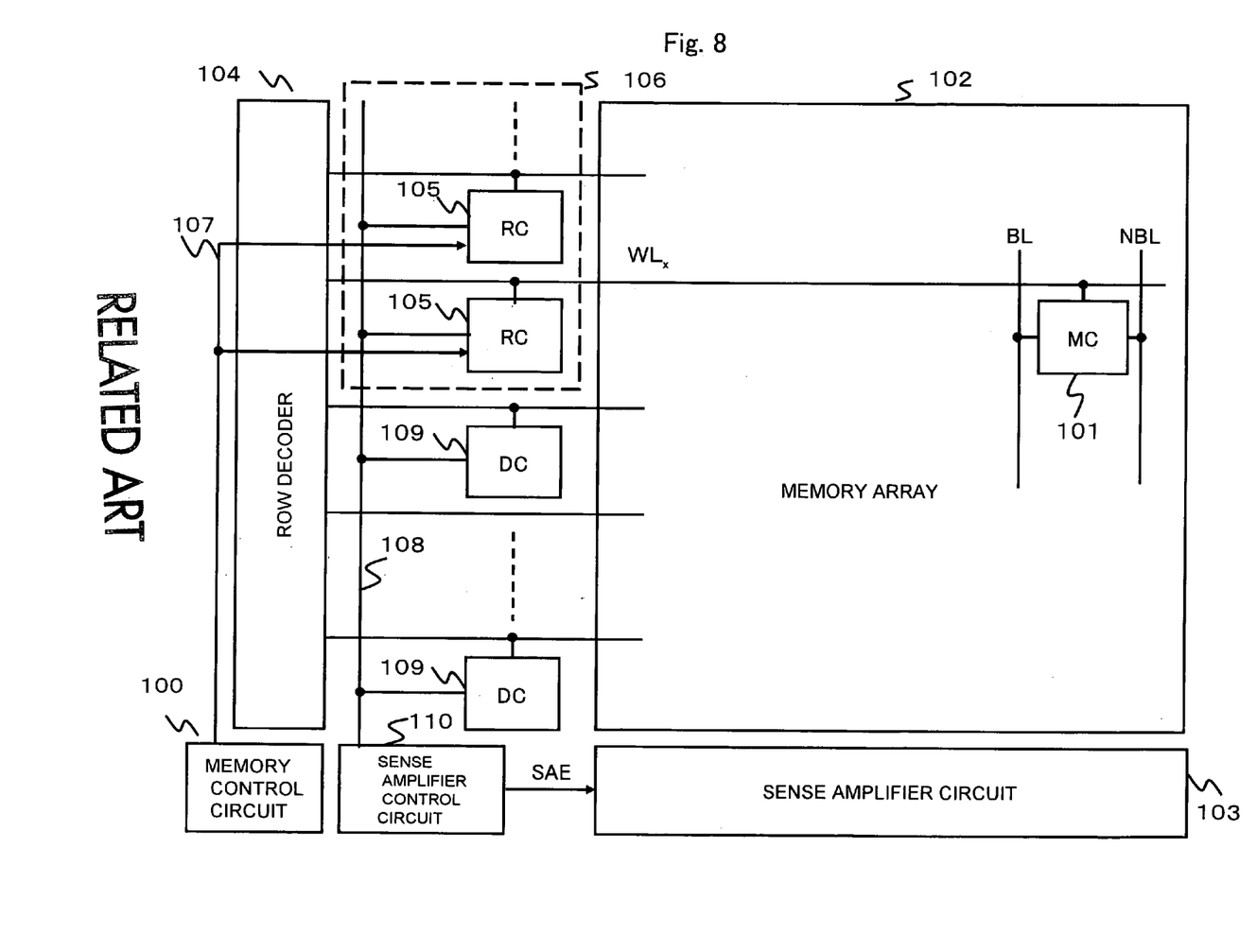
FIG. 8 is a functional block diagram which shows an example of the structure of a semiconductor memory device which uses a replica circuit.

FIG. 8 is a functional block diagram which shows one example of the structure of a semiconductor memory device which uses a replica circuit. In FIG. 8, the semiconductor memory device comprises a memory control circuit 100, a memory array 102 formed by plural SRAM memory cells 101, a sense amplifier circuit 103 which amplifies and outputs signals transmitted from the memory cells 101 over bit lines BL and NBL, a row decoder 104 which is connected with the memory array 102, a replica circuit 106 comprising replica cells 105, a replica word line 107 which sends a signal to the replica circuit 106, a replica bit line 108 which is connected with the replica cells 105, dummy cells 109 which are connected with the replica bit line 108, and a sense amplifier control circuit 110 which is connected with the replica bit line 108 and sends a sense amplifier control signal SAE to the sense amplifier circuit 103.

As shown in FIG. 8, the memory cells 101 are connected in the row direction respectively with word lines WL0 through WLx which are output signal lines from the row decoder 104, and connected in the column direction with common bit lines BL and NBL.

Figure 1:
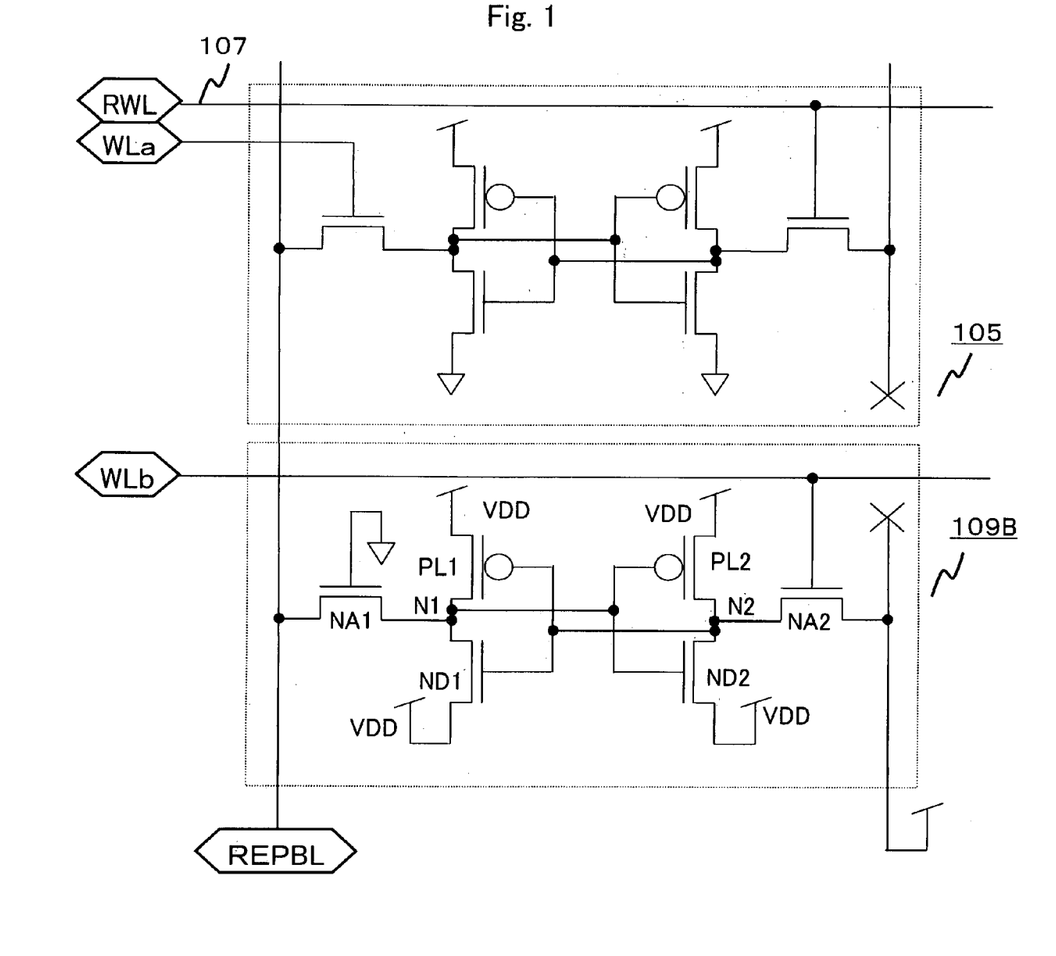
FIG. 1 is a circuitry diagram of a replica cell and a dummy cell in a semiconductor memory device according to a first embodiment of the present invention.
Figure 9:
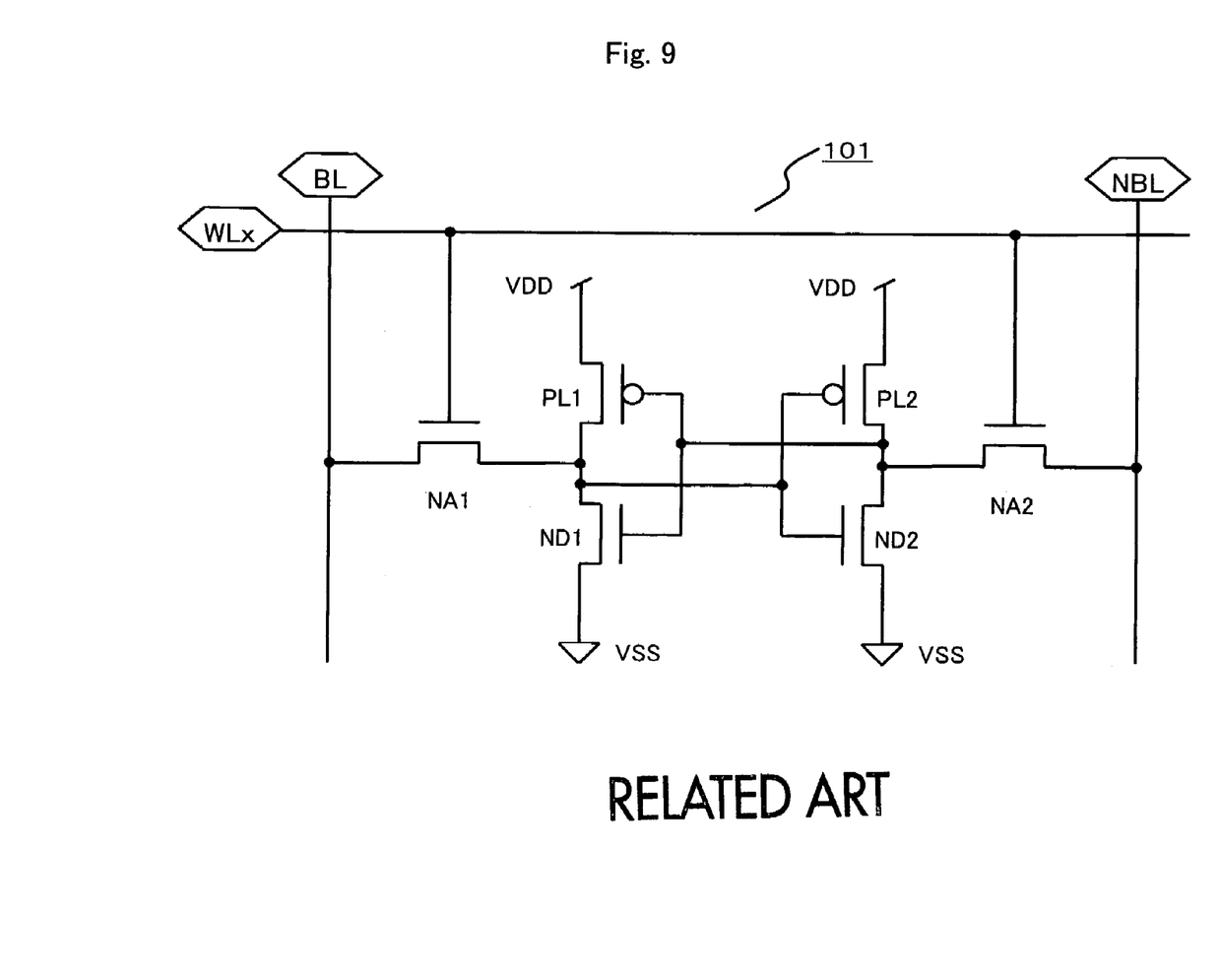
FIG. 9 is a circuitry diagram of an SRAM memory cell.

FIG. 9 is a circuitry diagram of the internal structure of the memory cell 101 which is shown in FIG. 1. In FIG. 9, the memory cell 101 is formed by an N-type transistor NA1 whose gate is connected with the word line WLx and whose source is connected with the bit line BL, an N-type transistor NA2 whose gate is connected with the word line WLx and whose source is connected with the bit line NBL, a P-type transistor PL1 whose source receives a power source voltage VDD and whose drain is connected with the drain of the N-type transistor NA1, an N-type transistor ND1 whose gate is connected with the gate of the P-type transistor PL1, whose drain is connected with the drain of the P-type transistor PL1 and whose source is connected with a ground potential VSS, a P-type transistor PL2 whose gate is connected with the drain of the N-type transistor NA1, whose source receives the power source voltage VDD and whose drain is connected with the drain of the N-type transistor NA2, and an N-type transistor ND2 whose gate is connected with the gate of the P-type transistor PL2, whose drain is connected with the drain of the P-type transistor PL2 and whose source is connected with the ground potential VSS.

The P-type transistor PL1 and the N-type transistor ND1 form a first inverter, while the P-type transistor PL2 and the N-type transistor ND2 form a second inverter. An input terminal and an output terminal of the first inverter are connected respectively with an output terminal and an input terminal of the second inverter, thereby forming a latch circuit.

Figure 10:
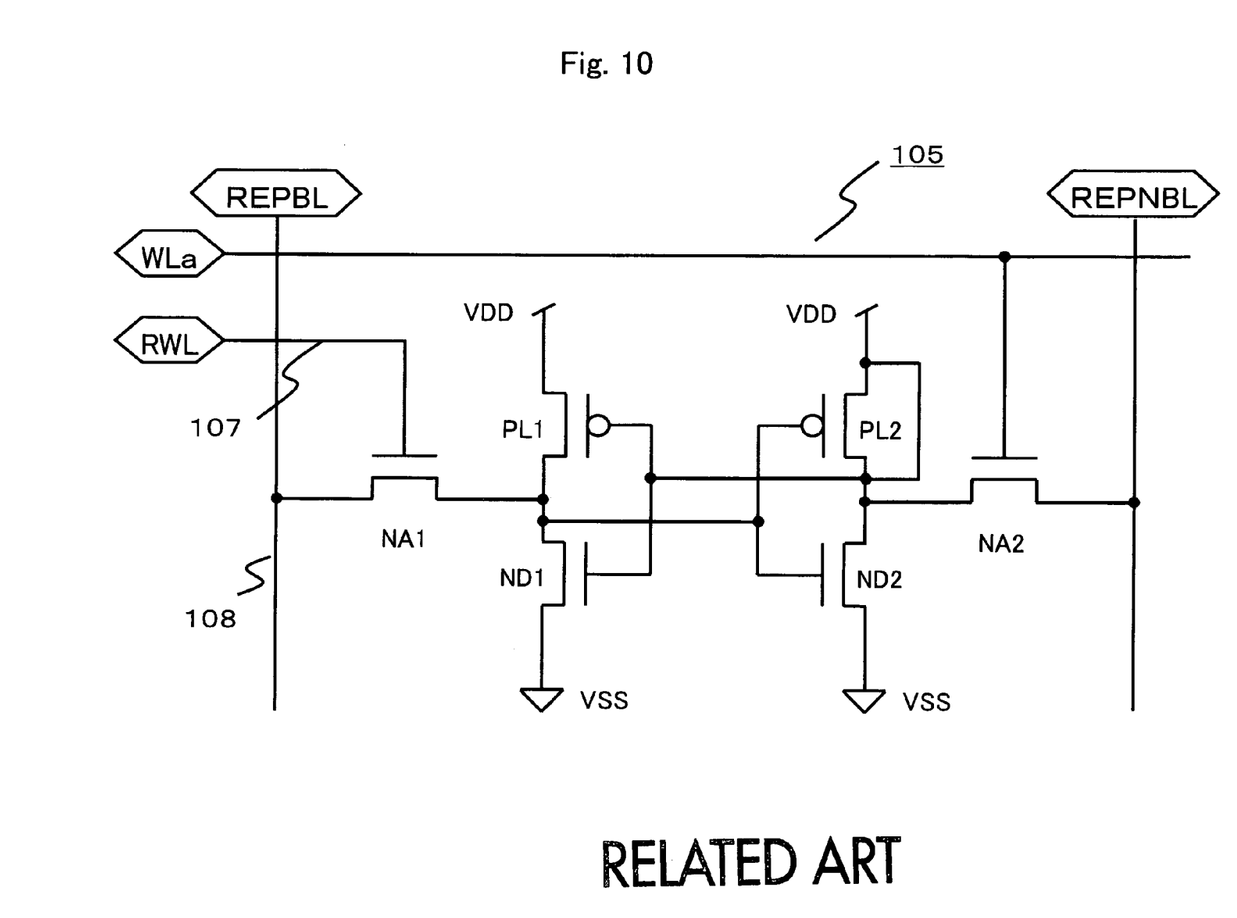
FIG. 10 is a circuitry diagram of a replica cell.

FIG. 10 is a circuitry diagram which shows the internal structure of the replica cell 105 which is shown in FIG. 8. In FIG. 10, transistors forming the replica cell 105 have the same sizes as the transistors forming the memory cell 101 which is shown in FIG. 9. In the latch circuit included in the replica cell 105, the drain and the source of the P-type transistor PL2 are short-circuited. The output level of the second inverter formed by the P-type transistor PL2 and the N-type transistor ND2 is fixed at the High level. Meanwhile, the gate of the N-type transistor ND1 is connected with a replica word line RWL 107. The reference symbol REPBL denotes a replica bit line and the reference symbol REPNBL denotes a replica bit bar line. The replica bit line REPBL corresponds to the replica bit line 108 which is shown in FIG. 8. The reference symbol WLa denotes a word line.

Figure 11:
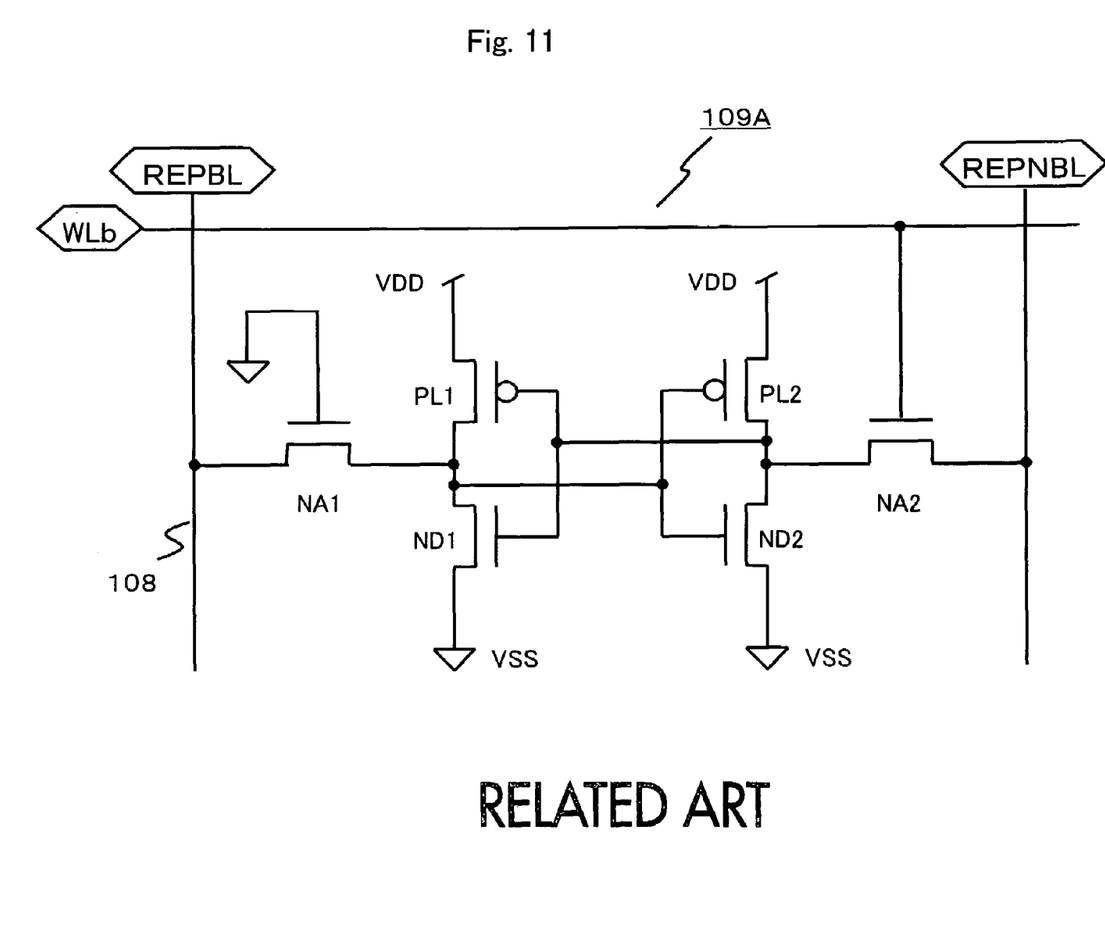
FIG. 11 is a circuitry diagram which shows a conventional technique regarding a dummy cell.

FIG. 11 is a circuitry diagram of the internal structure of the dummy cell 109 which is shown in FIG. 8. In FIG. 11, transistors forming the dummy cell 109A have the same sizes as the transistors forming the memory cell 101 which is shown in FIG. 9. In addition, the gate of the N-type transistor ND1 is fixed at the Low level. The reference symbol WLb denotes a word line.

An operation of the conventional semiconductor memory device having the structure above will now be described. First, one of the word lines WL0 through WLx which are the output signal lines from the row decoder 104 is selected, whereby data in the memory cell 101 are read to the bit lines BL and NBL. The bit lines BL and NBL and the replica bit line REPBL 108 are pre-charged to the High level and become floating upon selection from among the word lines WL0 through WLx. The multiple bit lines BL and the multiple bit lines NBL are provided, and plural pieces of data are read to the associated bit lines BL and NBL.

At about the same timing as the timing of selecting from among the word lines WL0 through WLx, the replica word line RWL 107 which is an output signal line from the memory control circuit 100 is driven. This makes the transistors of the n replica cells 105 transit the signal level on the replica bit line RBL 108 from the High level to the Low level at a speed which is n times as fast as that of the memory cells 101. The sense amplifier control circuit 110 then detects the signal level on the replica bit line RBL 108 and generates the sense amplifier control signal SAE, and the sense amplifier circuit 103, receiving the sense amplifier control signal SAE, amplifies the data on the bit lines BL and NBL.

Where the power source voltage VDD is 1.2 V for example, if one wishes to start up the sense amplifier circuit 103 while reading of data from each memory cell 101 to the associated bit lines BL and NBL accompanies a potential difference of 100 mV, one may decide that the number n of the replica cells 105 to choose is 6. In other words, the signal level on the replica bit line RBL 108 transmits 600 mV, that is, down to half the power source voltage VDD at any desired timing that the sense amplifier is supposed to start up, i.e., in response to a potential difference of 100 mV between data read to the bit lines BL and NBL. This is beneficial in that it is possible to generate the sense amplifier control signal SAE at simple CMOS gates without using a complicated potential detection circuit.

Patent Literature 1: Japanese Patent Application Laid-Open Gazette No. H9-259589 (page 4, FIG. 7)

Patent Literature 2: Japanese Patent Application Laid-Open Gazette No. 2003-36678 (pages 5-6, FIGS. 5-6)

However, in the structure above of this semiconductor memory device, internal nodes of the dummy cell 109 are not fixed. The potential at the drain of the N-type transistor NA1 shown in FIG. 11 could therefore change to the Low level. When this occurs, due to a leak current, the N-type transistor NA1 shown in FIG. 11 makes the replica bit line RBL 108 more quickly transit from the High level to the Low level. This shortens the time given to the sense amplifier control circuit 110 to detect the transition on the replica bit line RBL 108, making it impossible to obtain the desired timing, or in some situations, the sense amplifier control signal SAE could come too early and cause the sense amplifier circuit 103 to malfunction.

Meanwhile, in the semiconductor memory device according to Patent Literature 2, the status of the dummy cell is fixed such that the side closer to the replica bit line which is driven to the Low level will remain at the High level, for the purpose of preventing a leak current from the dummy cell from quickening the timing at which the replica bit line is driven to the Low level. However, since the opposite side of the dummy cell is fixed to the Low level to this end, there may arise leakage between the dummy cell and the opposite replica bit line to the replica bit line which is driven to the Low level, and hence an unwanted current may flow.

SUMMARY OF THE INVENTION

The present aims at providing a semiconductor memory device which suppresses a leak current flowing from a replica bit line to a dummy cell and therefore delivers optimal start-up timing to a sense amplifier circuit while eliminating an unwanted current.

To achieve this object, the semiconductor memory device according to the present invention comprises: a memory array including plural memory cells connected with a word line and a bit line; a sense amplifier circuit which amplifies data read from one memory cell of the memory array to the bit line; a replica circuit which includes plural stages of replica cells having the same elements as each one of the plural memory cells and connected with a common replica bit line, and which outputs to the common replica bit line a signal which is at a level which corresponds to the number of the plural stages of replica cells; a dummy cell which is connected as a load with the common replica bit line; and a sense amplifier control circuit which receives the signal on the replica bit line and controls the timing of a signal which starts up the sense amplifier circuit.

The dummy cell comprises a first, a second, a third and a fourth transistors of a first conductive type and a first and a second transistors of a second conductive type.

The drain, the gate and the source of the first transistor of the first conductive type are connected respectively with the replica bit line, a first constant voltage source and a first node. The drain, the gate and the source of the second transistor of the first conductive type are connected respectively with the first node, a second node and a second constant voltage source. The drain and the source of the third transistor of the first conductive type are connected respectively with a replica bit bar line and the second node. The drain, the gate and the source of the fourth transistor of the first conductive type are connected respectively with the second node, the first node and the second constant voltage source. The drain, the gate and the source of the first transistor of the second conductive type are connected respectively with the first node, the second node and the second constant voltage source. The drain, the gate and the source of the second transistor of the second conductive type are connected respectively with the second node, the first node and the second constant voltage source.

In the structure above, a tap cell may be disposed between the dummy cell and the memory array.

Further, a dummy cell which disconnects the word line may be disposed between the dummy cell and the tap cell in the structure above.

Alternatively, in the structure above, the dummy cell has the following structure for instance. The first and the second transistors of the first conductive type are arranged side by side vertically such that they share a diffusion layer. The third and the fourth transistors of the first conductive type are arranged side by side vertically such that they share a diffusion layer, at positions of point symmetry with respect to the first and the second transistors of the first conductive type about the center of the cell. The first transistor of the second conductive type shares a first straight gate wire with the second transistor of the first conductive type, and is located between the second transistor of the first conductive type and the third transistor of the first conductive type yet closer to the second transistor of the first conductive type. The second transistor of the second conductive type shares a second straight gate wire with the fourth transistor of the first conductive type, and is located at a position of point symmetry with respect to the first transistor of the second conductive type about the center of the cell between the first transistor of the first conductive type and the fourth transistor of the first conductive type.

There is a first contact provided in a diffusion layer area of the source of the first transistor of the first conductive type. There is a second contact provided between the first and the second transistors of the first conductive type. There is a third contact provided in a diffusion area of the source of the second transistor of the first conductive type. There is a fourth contact provided on a gate wire of the first transistor of the first conductive type on the opposite side to the second transistor of the second conductive type. There are a fifth and a sixth contacts provided respectively in a diffusion layer area of the source and that of the drain of the first transistor of the second conductive type. There is a seventh contact provided on the first gate wire between the first transistor of the second conductive type and the third transistor of the first conductive type. There is an eighth contact provided in a diffusion layer area of the source of the third transistor of the first conductive type. There is a ninth contact provided between the third and the fourth transistors of the first conductive type. There is a tenth contact provided in a diffusion area of the source of the fourth transistor of the first conductive type. There is an eleventh contact provided on a gate wire of the third transistor of the first conductive type on the opposite side to the first transistor of the second conductive type. There are a twelfth and a thirteenth contacts provided respectively in a diffusion layer area of the source and that of the drain of the second transistor of the second conductive type. There is a fourteenth contact provided on the second gate wire between the second transistor of the second conductive type and the first transistor of the first conductive type.

The first contact is connected with the replica bit line. The second, the sixth and the fourteenth contacts are connected with each other by a first metal wire. The seventh, the ninth and the thirteenth contacts are connected with each other by a second metal wire. The third and the fifth contacts are connected with the second constant voltage source by a third metal wire. The tenth and the twelfth contacts are connected with the second constant voltage source by a fourth metal wire. The fifth and the twelfth contacts are connected with each other by a fifth metal wire. The fifth metal wire is connected with the second constant voltage source. The fourth contact is connected with the first constant voltage source. The eighth contact is connected with the replica bit bar line. The eleventh contact is connected with the word line.

Alternatively, in the structure above, the dummy cell may have the following structure for example. The first and the second transistors of the first conductive type are arranged vertically such that they share a diffusion layer. The third and the fourth transistors of the first conductive type are arranged vertically such that they share a diffusion layer, at symmetrical positions with respect to the first and the second transistors of the first conductive type about the center of the cell. The second and the fourth transistors of the first conductive type are arranged side by side horizontally such that they share a diffusion layer. The first and the second transistors of the second conductive type are arranged side by side horizontally such that they share a diffusion layer.

The gate of the second transistor of the first conductive type and the gate of the first transistor of the second conductive type are connected by a first straight gate wire. The gate of the fourth transistor of the first conductive type and the gate of the second transistor of the second conductive type are connected by a second straight gate wire. The gate of the first transistor of the first conductive type is connected with the first constant voltage source. The gate of the third transistor of the first conductive type is connected with the word line.

There is a first contact provided in the source of the first transistor of the first conductive type. There is a second contact provided in a diffusion area between the first and the second transistors of the first conductive type. There is a third contact provided in the drain of the first transistor of the second conductive type. There is a fourth contact provided on the first gate wire. There is a fifth contact provided in the source of the third transistor of the first conductive type. There is a sixth contact provided in a diffusion area between the third and the fourth transistors of the first conductive type. There is a seventh contact provided in the drain of the second transistor of the second conductive type. There is an eighth contact provided on the second gate wire. There is a ninth contact provided in a diffusion area between the second and the fourth transistors of the first conductive type. There is a tenth contact provided in a diffusion area between the first and the second transistors of the second conductive type.

The second, the third and the eighth contacts are connected with each other by a first metal wire. The fourth, the sixth and the seventh contacts are connected with each other by a second metal wire. The ninth and the tenth contacts are connected with each other by a third metal wire. The third metal wire is connected with the second constant voltage source. The first contact is connected with the replica bit line. The fifth contact is connected with the replica bit bar line.

Alternatively, in the structure above, the dummy cell may have the following structure for instance. The first and the second transistors of the first conductive type are arranged vertically such that they share a diffusion layer. The third and the fourth transistors of the first conductive type are arranged vertically such that they share a diffusion layer, at symmetrical positions with respect to the first and the second transistors of the first conductive type about the center of the cell. The first transistor of the second conductive type is arranged sharing a first gate wire with the second transistor of the first conductive type. The second transistor of the second conductive type is arranged sharing a second gate wire with the fourth transistor of the first conductive type.

There is a first contact provided in the source of the first transistor of the first conductive type. There is a second contact provided in a diffusion area between the first and the second transistors of the first conductive type. There is a third contact provided in the drain of the first transistor of the second conductive type. There is a fourth contact provided in a diffusion area of the source of the second transistor of the first conductive type. There is a fifth contact provided in a diffusion area of the source of the first transistor of the second conductive type. There is a sixth contact provided in the source of the third transistor of the first conductive type. There is a seventh contact provided in a diffusion area between the third and the fourth transistors of the first conductive type. There is an eighth contact provided in the drain of the second transistor of the second conductive type. There is a ninth contact provided in a diffusion area of the source of the fourth transistor of the first conductive type. There is a tenth contact provided in a diffusion area of the source of the second transistor of the second conductive type.

The second and the third contacts are connected with each other by a first metal wire. The seventh and the eighth contacts are connected with each other by a second metal wire.

There is an eleventh contact provided on the first metal wire. There is a twelfth contact provided on the second metal wire. There is a thirteenth contact provided on the second gate wire.

The eleventh and the thirteenth contacts are connected with each other by a third metal wire. The twelfth contact is connected with the first gate wire. The fourth, the fifth, the ninth and the tenth contacts are connected with each other by a fourth metal wire.

The semiconductor memory device according to the present invention attains a remarkable effect of realizing a semiconductor memory device in which a leak current from a replica bit line to a dummy cell is suppressed and optimal start-up timing is given to a sense amplifier circuit.

DETAILED DESCRIPTION OF PREFERRED EMBODIMENTS

First Embodiment

FIG. 1 is a circuitry diagram which shows the structures of a replica cell 105 and a dummy cell 109B in the semiconductor memory device according to the first embodiment of the present invention.

The dummy cell 109B has the same structure as that of a dummy cell 109A, except for that the sources of a second and a fourth N-type MOS transistors ND1 and ND2 and the sources of a first and a second P-type MOS transistors PL1 and PL2 are connected to a power source voltage VDD which is at the High level. Other than this, the structure is identical to that of the dummy cell 109A.

The dummy cell 109B having this structure will now be described.

In the dummy cell 109B, the sources of the second and the fourth N-type MOS transistors ND1 and ND2 and the sources of the first and the second P-type MOS transistors PL1 and PL2 are connected to the power source voltage VDD which is at the High level. Due to this, the second and the fourth N-type MOS transistors ND1 and ND2 and the first and the second P-type MOS transistors PL1 and PL2 charge a first node N1 and a second node N2 to the High level. The first node N1 and the second node N2 consequently lose a potential difference against a replica bit line 108. Hence, it is possible to reduce a leak current which flows through a first N-type transistor NA1 of the dummy cell 109B from the replica bit line 108, during reduction of the potential on the replica bit line 108. The speed at which the potential on the replica bit line 108 decreases will therefore never be quickened. This makes it possible to realize a semiconductor memory device which is capable of feeding optimal start-up timing to a sense amplifier circuit, which is remarkably effective in practical applications.

Figure 2:
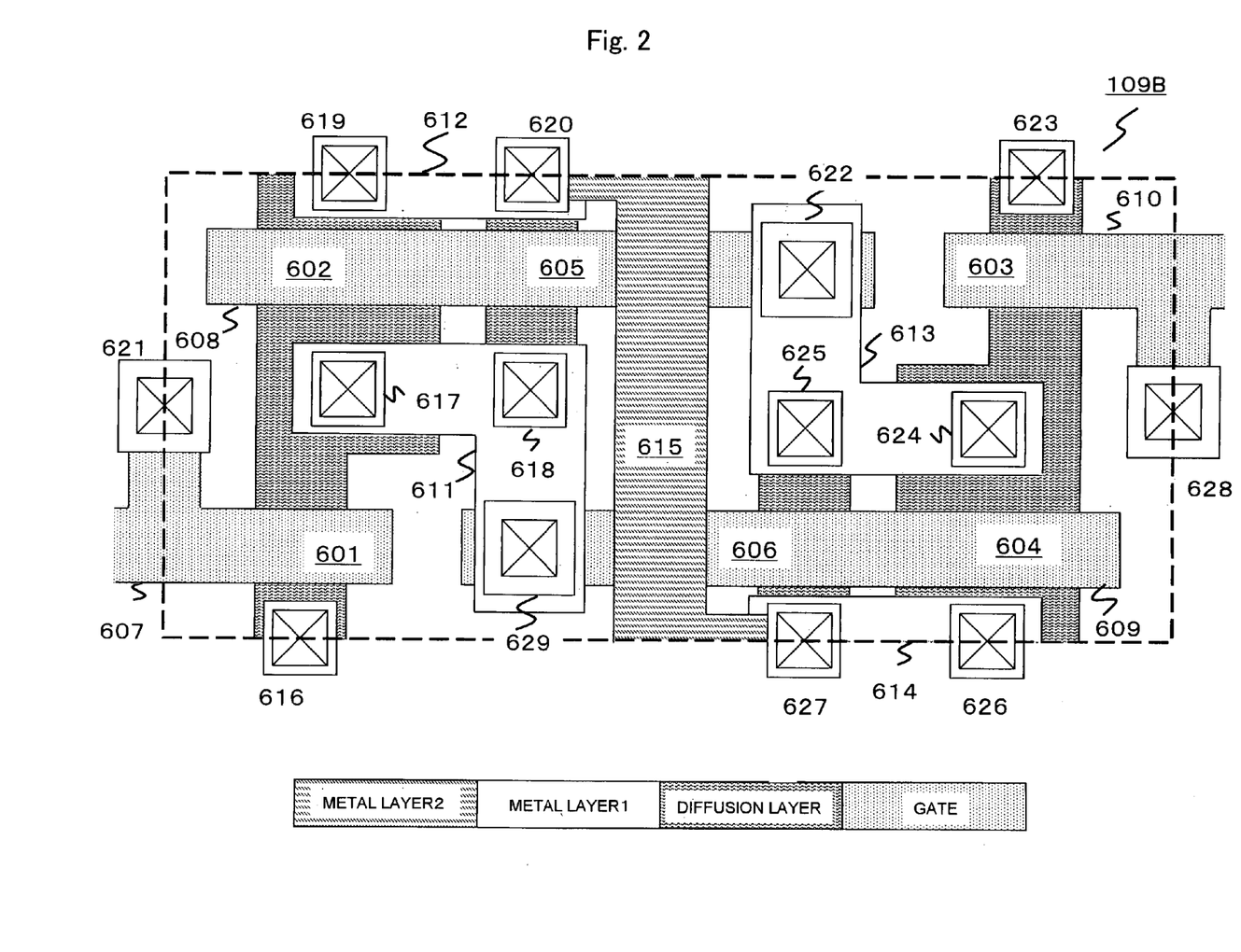
FIG. 2 is a layout diagram which shows a specific layout of the dummy cell in the semiconductor memory device according to the first embodiment of the present invention.

FIG. 2 is a layout diagram which shows a specific first example of the layout structure of the dummy cell 109B in the semiconductor memory device according to the first embodiment of the present invention. In FIG. 2, a metal layer 1, a metal layer 2, a diffusion layer and gates are distinguished by way of pattern as shown in FIG. 2 (which is similar in FIGS. 3 and 5 as well).

The semiconductor memory device according to the embodiment has a structure as that shown in FIG. 2.

N-type MOS transistors 601 and 602 are arranged side by side vertically such that they share a diffusion layer. N-type MOS transistors 603 and 604 are arranged side by side vertically such that they share a diffusion layer area, at positions of point symmetry with respect to the N-type MOS transistors 601 and 602 about the center of the cell.

A P-type MOS transistor 605 shares a straight gate wire 608 with the N-type MOS transistor 602, and is located between the N-type MOS transistor 602 and the N-type MOS transistor 603 yet closer to the N-type MOS transistor 602. A P-type MOS transistor 606 shares a straight gate wire 609 with the N-type MOS transistor 604, and is located at a position of point symmetry with respect to the P-type MOS transistor 605 about the center of the cell between the N-type MOS transistor 601 and the N-type MOS transistor 604.

There is a contact 616 in the diffusion layer area of the drain of the N-type MOS transistor 601. There is a contact 617 between the N-type MOS transistors 601 and 602. There is a contact 619 in the diffusion area of the source of the N-type MOS transistor 602. There is a contact 621 over a gate wire 607 of the N-type MOS transistor 601, on the opposite side to the P-type MOS transistor 606. There are contacts 620 and 618 in the diffusion layer areas of the source and the drain respectively of the P-type MOS transistor 605.

There is a contact 622 on the gate wire 608 between the P-type MOS transistor 605 and the N-type MOS transistor 603. There is a contact 623 in the diffusion layer area of the drain of the N-type MOS transistor 603. There is a contact 624 between the N-type MOS transistors 603 and 604. There is a contact 626 in the diffusion area of the source of the N-type MOS transistor 604. There is a contact 628 over a gate wire 610 of the N-type MOS transistor 603, on the opposite side to the P-type MOS transistor 605. There are contacts 627 and 625 in the diffusion layer areas of the source and the drain respectively of the P-type MOS transistor 606. There is a contact 629 over a gate wire 609 between the P-type MOS transistor 606 and the N-type MOS transistor 601.

The contact 616 is connected with the replica bit line REPBL in a different layer than a first layer, via the contacts and the metal wires. The contacts 617, 618 and 629 are connected with each other by a metal wire 611 in the first layer. The contacts 622, 624 and 625 are connected with each other by a metal wire 613 in the first layer. The contacts 619 and 620 are connected with the High level by a metal wire 612 in the first layer. The contacts 626 and 627 are connected with the High level by a metal wire 614 in the first layer. The contacts 620 and 627 are connected with each other by a metal wire 615 in a second layer. The metal wire 615 is connected with the High level. The contact 621 is connected with the Low level in a different layer than the first layer, via the contacts and the metal wires. The contact 623 is connected with the replica bit bar line REPNBL in a different layer than the first layer, via the contacts and the metal wires. The contact 628 is connected with the word line in a different layer than the first layer, via the contacts and the metal wires.

Figure 3:
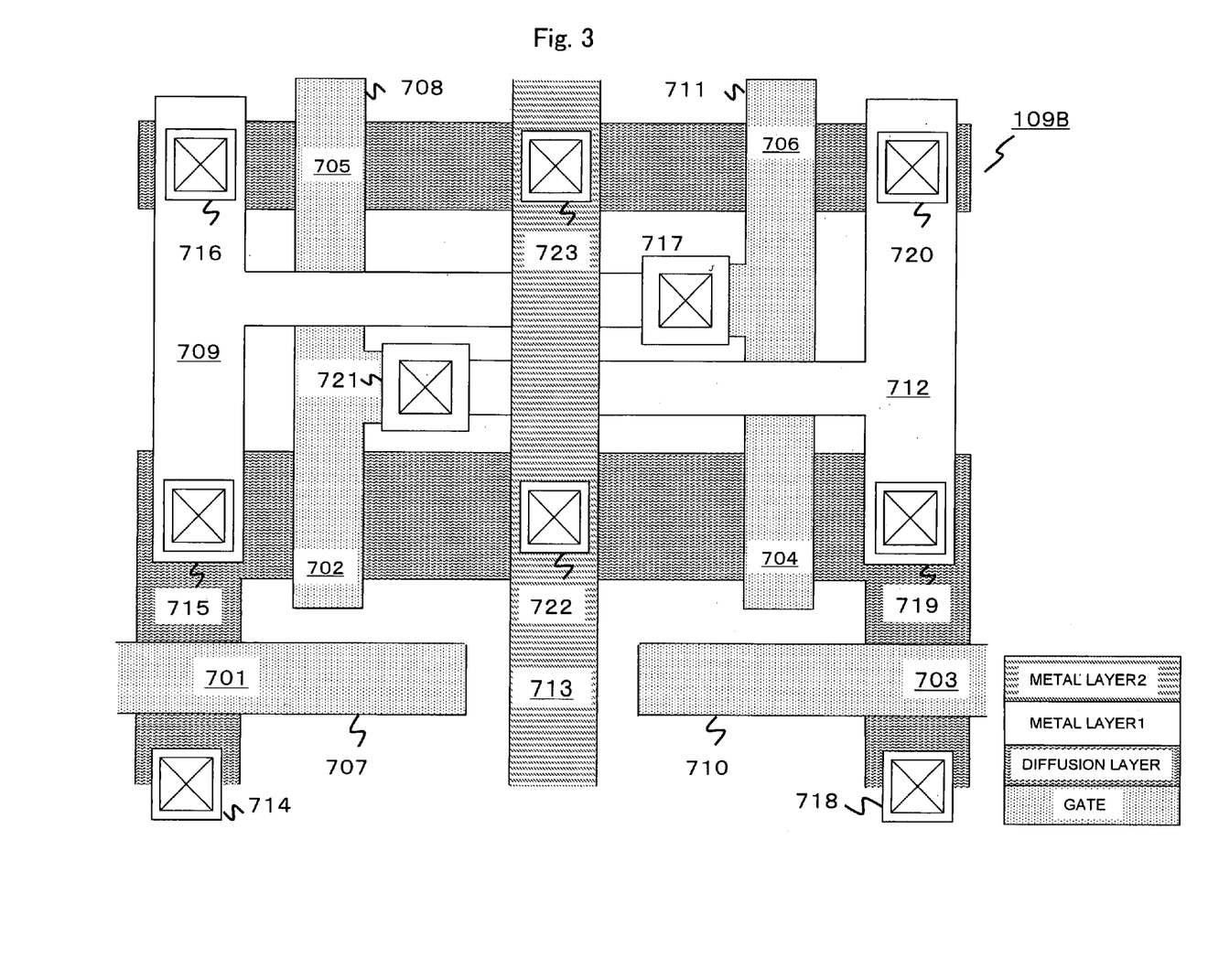
FIG. 3 is a layout diagram which shows other specific layout of the dummy cell in the semiconductor memory device according to the first embodiment of the present invention.

FIG. 3 is a layout diagram which shows a specific second example of the layout structure of the dummy cell 109B in the semiconductor memory device according to the first embodiment of the present invention.

The semiconductor memory device according to the embodiment has a structure as that shown in FIG. 3.

N-type MOS transistors 701 and 702 are arranged vertically such that they share a diffusion layer. The N-type MOS transistors 703 and 704 are arranged vertically such that they share the diffusion layer, at symmetrical positions with respect to the N-type MOS transistors 701 and 702 about the center of the cell. The N-type MOS transistors 702 and 704 are arranged side by side horizontally such that they share the diffusion layer. P-type MOS transistors 705 and 706 are arranged side by side horizontally such that they share the diffusion layer. The gate of the N-type MOS transistor 702 and the gate of the P-type MOS transistors 705 are connected by a straight gate wire 708. The gate of the N-type MOS transistor 704 and the gate of the P-type MOS transistors 706 are connected by a straight gate wire 711. The gate of the N-type MOS transistor 701 is connected with the Low level via a gate wire 707 and a contact. The gate of the N-type MOS transistor 703 is connected with the word line via a gate wire 710 and a contact.

There is a contact 714 in the source of the N-type MOS transistor 701. There is a contact 715 in the diffusion area between the N-type MOS transistors 701 and 702. There is a contact 716 in the drain of the P-type MOS transistor 705. There is a contact 721 over the gate wire 708. There is a contact 718 in the source of the N-type MOS transistor 703. There is a contact 719 in the diffusion area between the N-type MOS transistors 703 and 704. There is a contact 720 in the drain of the P-type MOS transistor 706. There is a contact 717 over the gate wire 711. There is a contact 722 in the diffusion area between the N-type MOS transistors 702 and 704. There is a contact 723 in the diffusion area between the P-type MOS transistors 705 and 706.

The contacts 715, 716 and 717 are connected with each other by a metal wire 709 in the first layer. The contacts 719, 720 and 721 are connected with each other by a metal wire 712 in the first layer. The contacts 722 and 723 are connected with each other by a metal wire 713 in the second layer. The metal wire 713 is connected with the High level. The contact 714 is connected with the replica bit line REPBL via the contacts and the metal wires. The contact 718 is connected with the replica bit bar line REPNBL via the contacts and the metal wires.

Second Embodiment

Figure 4:
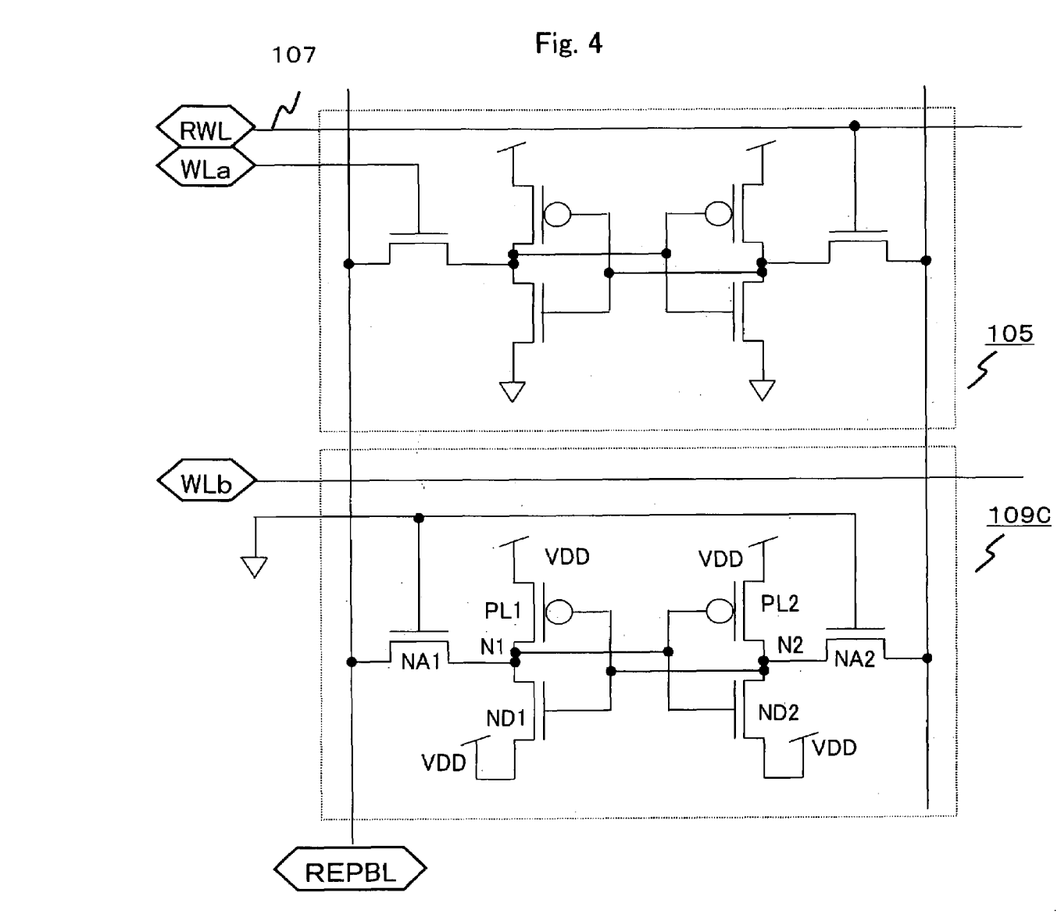
FIG. 4 is a circuitry diagram which shows the structures of a replica cell and a dummy cell in a semiconductor memory device according to a second embodiment of the present invention.

FIG. 4 is a circuitry diagram which shows the structures of a replica cell 105 and a dummy cell 109C in a semiconductor memory device according to the second embodiment of the present invention.

In FIG. 4, in the dummy cell 109C in the semiconductor memory device according to this embodiment, the sources of a second and a fourth N-type MOS transistors ND1 and ND2 and the sources of a first and a second P-type MOS transistors PL1 and PL2 are connected to the High level. Further, the gates of a first and a third N-type transistors NA1 and NA2 are both connected to the Low level. Other than this, the structure is the same as that of the dummy cell 109B which is shown in FIG. 1.

The dummy cell 109C having this structure will now be described.

In the dummy cell 109C, the sources of the second and the fourth N-type MOS transistors ND1 and ND2 and the sources of the first and the second P-type MOS transistors PL1 and PL2 are connected to a power source voltage VDD which is at the High level. Hence, the second and the fourth N-type MOS transistors ND1 and ND2 and the first and the second P-type MOS transistors PL1 and PL2 charge the first node N1 and the second node N2 to the High level. The first node N1 and the second node N2 consequently lose a potential difference against a replica bit line 108. Hence, it is possible to reduce a leak current which flows through the first N-type transistor NA1 of the dummy cell 109C from the replica bit line 108, during reduction of the potential on the replica bit line 108. The speed at which the potential on the replica bit line 108 decreases will therefore never be quickened. This makes it possible to realize a semiconductor memory device which is capable of feeding optimal start-up timing to a sense amplifier circuit, which is remarkably effective in practical applications.

Figure 5:
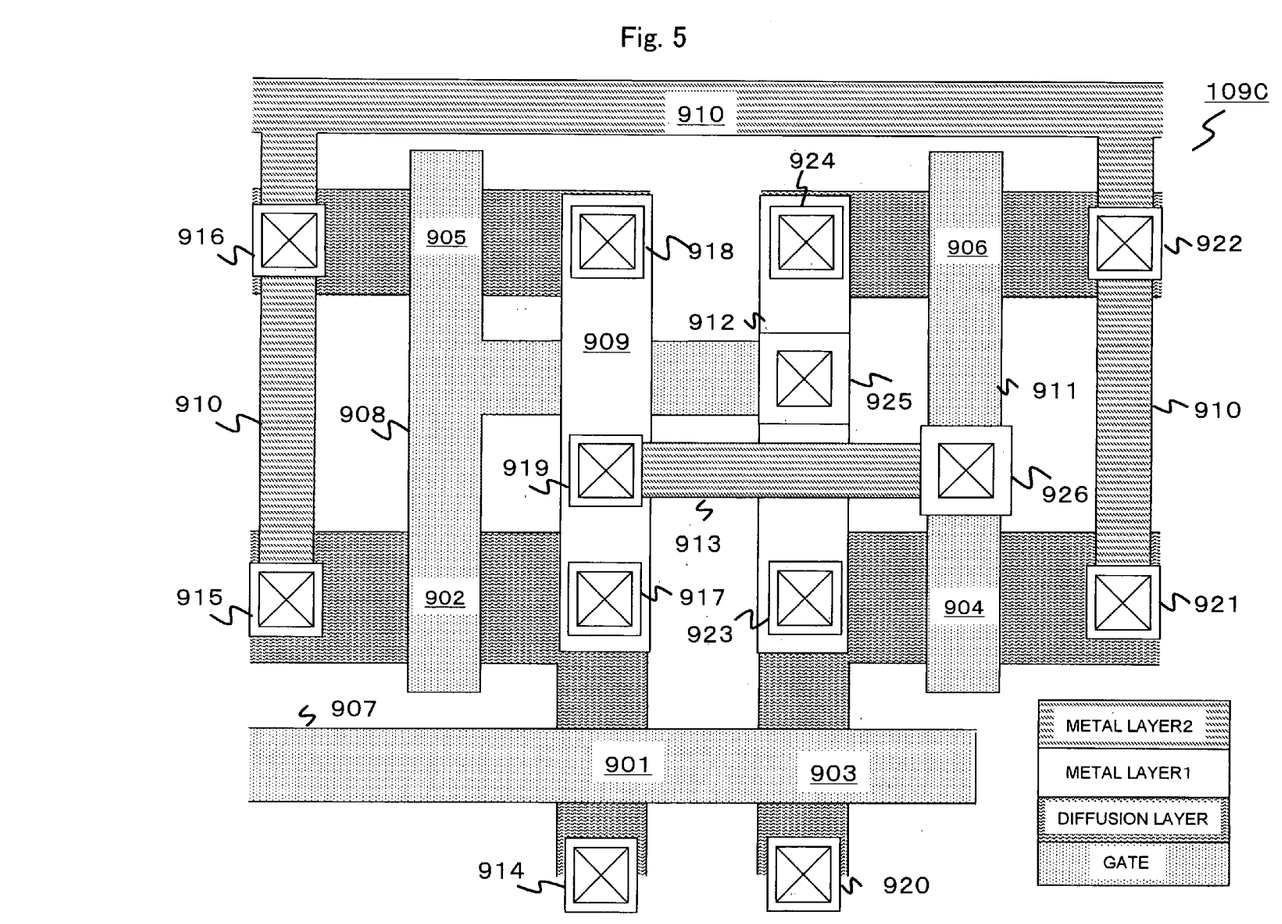
FIG. 5 is a layout diagram which shows a specific layout of the dummy cell in the semiconductor memory device according to the second embodiment of the present invention.

FIG. 5 is a layout diagram which shows a specific example of the layout of the dummy cell 109C in the semiconductor memory device according to the second embodiment of the present invention.

In FIG. 5, N-type MOS transistors 901 and 902 are arranged vertically such that they share a diffusion layer. N-type MOS transistors 903 and 904 are arranged vertically such that they share a diffusion layer, at symmetrical positions with respect to the N-type MOS transistors 901 and 902 about the center of the cell.

A P-type MOS transistor 905 is arranged sharing a gate wire 908 with the N-type MOS transistor 902. A P-type MOS transistor 906 is arranged sharing a gate wire 911 with the N-type MOS transistor 904. The gates of the N-type MOS transistors 901 and 903 share a gate wire 907 and are connected to the Low level.

There is a contact 914 in the source of the N-type MOS transistor 901. There is a contact 917 in the diffusion area between the N-type MOS transistors 901 and 902. There is a contact 918 in the drain of the P-type MOS transistor 905. There is a contact 915 in the diffusion area of the source of the N-type MOS transistor 902. There is a contact 916 in the diffusion area of the source of the P-type MOS transistor 905. There is a contact 920 in the source of the N-type MOS transistor 903. There is a contact 923 in the diffusion area between the N-type MOS transistors 903 and 904. There is a contact 924 in the drain of the P-type MOS transistor 906. There is a contact 921 in the diffusion area of the source of the N-type MOS transistor 904. There is a contact 922 in the diffusion area of the source of the P-type MOS transistor 906.

The contacts 917 and 918 are connected with each other by a metal wire 909 in a first layer. The contacts 923 and 924 are connected with each other by a metal wire 912 in the first layer.

There is a contact 919 over the metal wire 909. There is a contact 925 over the metal wire 912. There is a contact 926 over the metal wire 911.

The contacts 919 and 926 are connected with each other by a metal wire 913 in a second layer. The contact 925 is connected with the gate wire 908 by the gate wire. The contacts 915, 916, 921 and 922 are connected with each other by a metal wire 910 in the second layer and connected with the High level.

Third Embodiment

Figure 6:
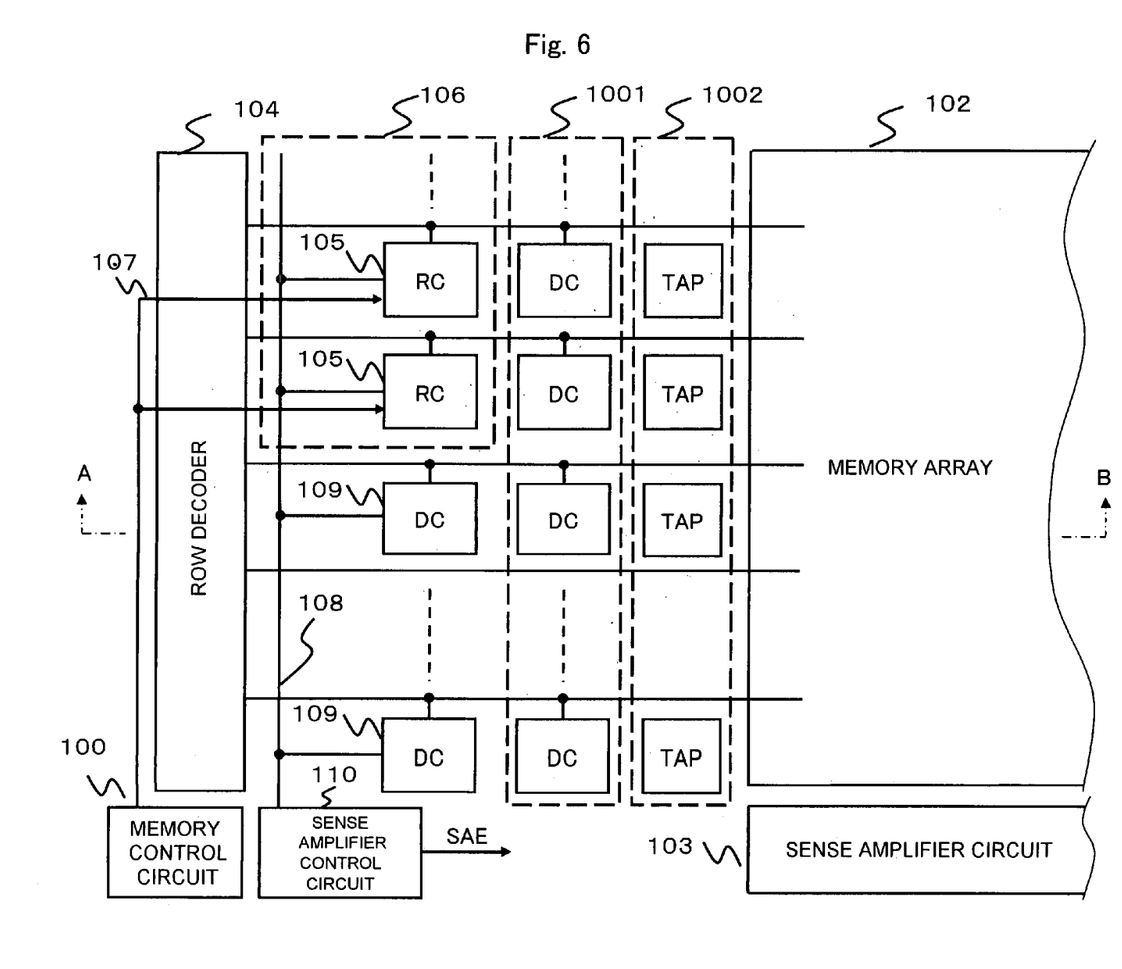
FIG. 6 is a functional block diagram which shows an example of the structure of a semiconductor memory device according to a third embodiment of the present invention.
Figure 7:
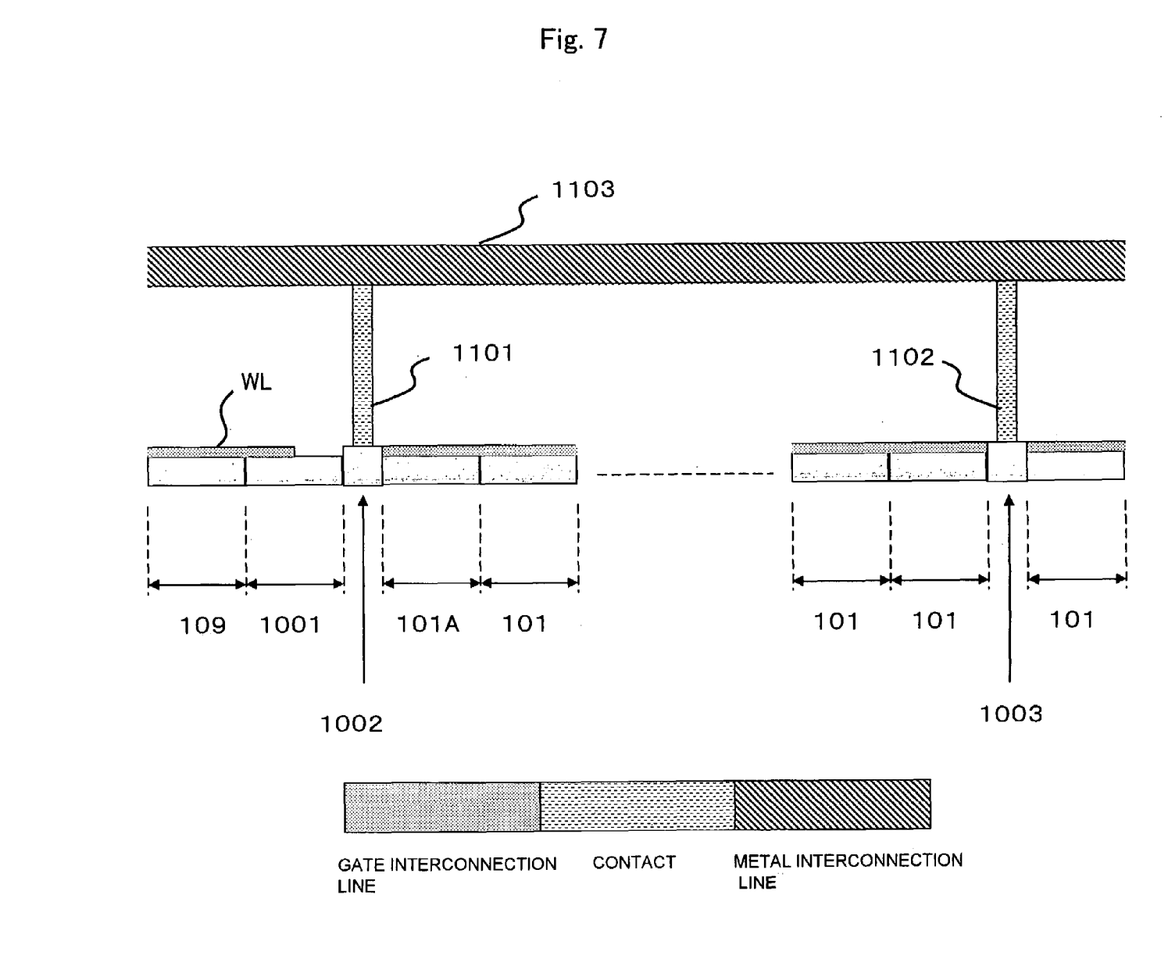
FIG. 7 is a partial cross sectional view of FIG. 6 taken along the line A-B.

FIG. 6 is a functional block diagram which shows the structure of a semiconductor memory device according to the third embodiment of the present invention. FIG. 7 is an A-B line partial cross sectional view which shows a part of the cross section taken along the dashed line A-B in FIG. 6. In FIG. 6, a gate wire, contacts and a metal wire are distinguished by way of pattern.

A difference from FIG. 8 is that there are a dummy cell 1001 and a tap cell 1002 between a memory array 102 and a dummy cell 109. A word line WL is disconnected inside the dummy cell 1001.

The semiconductor memory device having this structure will now be described.

In the case of a vertical-type memory cell, a gate wire usually transmits a signal carried on a word line. However, since a gate wire generally has a larger wire resistance than a metal wire, propagation of the signal takes time. Noting this, a signal carried on a word line is similarly transmitted by a metal wire and supplied to a gate wire via a tap cell 1003 which is disposed in the memory cell 102.

However, since the word line is disconnected inside the dummy cell in the third embodiment of the present invention, but for the tap cell 1002, the following problem could occur. In short, in an ordinary memory cell 101A, a signal carried on a word line is supplied via a metal wire 1103, then a contact 1102 and then the tap cell 1003 and the gate wire. This could delay signal propagation.

In light of this, the tap cell 1002 is disposed between the dummy cell 1001 and a memory array 107 and a contact 1101 connects the tap cell 1002 with the metal wire 1103, to thereby transmit a signal carried on the word line rapidly to the memory cell 101A as well.

Further, disconnection of the word line inside the dummy cell 109 could influence the replica bit line 108 which is connected with the dummy cell 109. It is therefore preferable to insert between the dummy cell 109 and the tap cell 1002 the dummy cell 1001 whose only purpose is to disconnect the word line.

The reason of disconnecting the word line is to make the dummy cell always unselected (See the dummy cell 109B shown in FIG. 1 and the dummy cell 109C shown in FIG. 4 for instance.).

INDUSTRIAL APPLICABILITY

The semiconductor memory device according to the present invention realizes an effect that it is possible to supply optimal start-up timing to the sense amplifier circuit owing to suppression of a leak current from the replica bit line to the dummy cell, and hence, is useful as an SRAM and the like.

The invention claimed is:

1. A semiconductor memory device, comprising:
a memory array including plural memory cells connected with a word line and a bit line;
a sense amplifier circuit which amplifies data read from one memory cell of said memory array to said bit line;
a replica circuit which includes plural stages of replica cells having the same elements as each one of said plural memory cells and connected with a common replica bit line, and which outputs to said common replica bit line a signal which is at a level which corresponds to the number of said plural stages of replica cells;
a dummy cell which is connected as a load with said common replica bit line; and
a sense amplifier control circuit which receives said signal on said replica bit line and controls the timing of a signal which starts up said sense amplifier circuit,
wherein said dummy cell comprises a first, a second, a third and a fourth transistors of a first conductive type and a first and a second transistors of a second conductive type,
the drain, the gate and the source of said first transistor of said first conductive type are connected respectively with said replica bit line, a first constant voltage source and a first node,
the drain, the gate and the source of said second transistor of said first conductive type are connected respectively with said first node, a second node and a second constant voltage source,
the drain and the source of said third transistor of said first conductive type are connected respectively with a replica bit bar line and said second node,
the drain, the gate and the source of said fourth transistor of said first conductive type are connected respectively with said second node, said first node and second constant voltage source,
the drain, the gate and the source of said first transistor of said second conductive type are connected respectively with said first node, said second node and said second constant voltage source, and
the drain, the gate and the source of said second transistor of said second conductive type are connected respectively with said second node, said first node and said second constant voltage source.

2. The semiconductor memory device of claim 1, wherein a tap cell is disposed between said dummy cell and said memory array.

3. The semiconductor memory device of claim 2, wherein a dummy cell which disconnects said word line is disposed between said dummy cell and said tap cell.

4. The semiconductor memory device of claim 1, wherein in said dummy cell,
said first and said second transistors of said first conductive type are arranged side by side vertically such that they share a diffusion layer,
said third and said fourth transistors of said first conductive type are arranged side by side vertically such that they share a diffusion layer, at positions of point symmetry with respect to said first and said second transistors of said first conductive type about the center of said cell,
said first transistor of said second conductive type shares a first straight gate wire with said second transistor of said first conductive type, and is located between said second transistor of said first conductive type and said third transistor of said first conductive type yet closer to said second transistor of said first conductive type,
said second transistor of said second conductive type shares a second straight gate wire with said fourth transistor of said first conductive type, and is located at a position of point symmetry with respect to said first transistor of said second conductive type about the center of said cell between said first transistor of said first conductive type and said fourth transistor of said first conductive type,
there is a first contact provided in a diffusion layer area of the source of said first transistor of said first conductive type,
there is a second contact provided between said first and said second transistors of said first conductive type,
there is a third contact provided in a diffusion area of the source of said second transistor of said first conductive type,
there is a fourth contact provided on a gate wire of said first transistor of said first conductive type on the opposite side to said second transistor of said second conductive type,
there are a fifth and a sixth contacts provided respectively in a diffusion layer area of the source and that of the drain of said first transistor of said second conductive type,
there is a seventh contact provided on said first gate wire between said first transistor of said second conductive type and said third transistor of said first conductive type,
there is an eighth contact provided in a diffusion layer area of the source of said third transistor of said first conductive type,
there is a ninth contact provided between said third and said fourth transistors of said first conductive type,
there is a tenth contact provided in a diffusion area of the source of said fourth transistor of said first conductive type, there is an eleventh contact provided on a gate wire of said third transistor of said first conductive type on the opposite side to said first transistor of said second conductive type, there are a twelfth and a thirteenth contacts provided respectively in a diffusion layer area of the source and that of the drain of said second transistor of said second conductive type, there is a fourteenth contact provided on said second gate wire between said second transistor of said second conductive type and said first transistor of said first conductive type, said first contact is connected with said replica bit line, said second, said sixth and said fourteenth contacts are connected with each other by a first metal wire, said seventh, said ninth and said thirteenth contacts are connected with each other by a second metal wire, said third and said fifth contacts are connected with said second constant voltage source by a third metal wire, said tenth and said twelfth contacts are connected with said second constant voltage source by a fourth metal wire, said fifth and said twelfth contacts are connected with each other by a fifth metal wire, said fifth metal wire is connected with said second constant voltage source, said fourth contact is connected with said first constant voltage source, said eighth contact is connected with said replica bit bar line, and said eleventh contact is connected with said word line.

5. The semiconductor memory device of claim 1, wherein in said dummy cell, said first and said second transistors of said first conductive type are arranged vertically such that they share a diffusion layer, said third and said fourth transistors of said first conductive type are arranged vertically such that they share a diffusion layer, at symmetrical positions with respect to said first and said second transistors of said first conductive type about the center of said cell, said second and said fourth transistors of said first conductive type are arranged side by side horizontally such that they share a diffusion layer, said first and said second transistors of said second conductive type are arranged side by side horizontally such that they share a diffusion layer, the gate of said second transistor of said first conductive type and the gate of said first transistor of said second conductive type are connected by a first straight gate wire, the gate of said fourth transistor of said first conductive type and the gate of said second transistor of said second conductive type are connected by a second straight gate wire, the gate of said first transistor of said first conductive type is connected with said first constant voltage source, the gate of said third transistor of said first conductive type is connected with said word line, there is a first contact provided in the source of said first transistor of said first conductive type, there is a second contact provided in a diffusion area between said first and said second transistors of said first conductive type, there is a third contact provided in the drain of said first transistor of said second conductive type, there is a fourth contact provided on said first gate wire, there is a fifth contact provided in the source of said third transistor of said first conductive type, there is a sixth contact provided in a diffusion area between said third and said fourth transistors of said first conductive type, there is a seventh contact provided in the drain of said second transistor of said second conductive type, there is an eighth contact provided on said second gate wire, there is a ninth contact provided in a diffusion area between said second and said fourth transistors of said first conductive type, there is a tenth contact provided in a diffusion area between said first and said second transistors of said second conductive type, said second, said third and said eighth contacts are connected with each other by a first metal wire, said fourth, said sixth and said seventh contacts are connected with each other by a second metal wire, said ninth and said tenth contacts are connected with each other by a third metal wire, said third metal wire is connected with said second constant voltage source, said first contact is connected with said replica bit line, and said fifth contact is connected with said replica bit bar line.

6. The semiconductor memory device of claim 1, wherein in said dummy cell, said first and said second transistors of said first conductive type are arranged vertically such that they share a diffusion layer, said third and said fourth transistors of said first conductive type are arranged vertically such that they share a diffusion layer, at symmetrical positions with respect to said first and said second transistors of said first conductive type about the center of said cell, said first transistor of said second conductive type is arranged sharing a first gate wire with said second transistor of said first conductive type, said second transistor of said second conductive type is arranged sharing a second gate wire with said fourth transistor of said first conductive type, there is a first contact provided in the source of said first transistor of said first conductive type, there is a second contact provided in a diffusion area between said first and said second transistors of said first conductive type, there is a third contact provided in the drain of said first transistor of said second conductive type, there is a fourth contact provided in a diffusion area of the source of said second transistor of said first conductive type, there is a fifth contact provided in a diffusion area of the source of said first transistor of said second conductive type, there is a sixth contact provided in the source of said third transistor of said first conductive type, there is a seventh contact provided in a diffusion area between said third and said fourth transistors of said first conductive type, there is an eighth contact provided in the drain of said second transistor of said second conductive type, there is a ninth contact provided in a diffusion area of the source of said fourth transistor of said first conductive type, there is a tenth contact provided in a diffusion area of the source of said second transistor of said second conductive type, said second and said third contacts are connected with each other by a first metal wire, said seventh and said eighth contacts are connected with each other by a second metal wire, there is an eleventh contact provided on said first metal wire, there is a twelfth contact provided on said second metal wire, there is a thirteenth contact provided on said second gate wire, said eleventh and said thirteenth contacts are connected with each other by a third metal wire, said twelfth contact is connected with said first gate wire, and said fourth, said fifth, said ninth and said tenth contacts are connected with each other by a fourth metal wire.

* * * * *